United States Patent
Locatelli et al.

(10) Patent No.: US 9,461,586 B2
(45) Date of Patent: Oct. 4, 2016

(54) SPINTRONIC OSCILLATOR, AND USE THEREOF IN RADIOFREQUENCY DEVICES

(75) Inventors: Nicolas Locatelli, Antony (FR); Bruno Marcilhac, Nozay (FR); Jean-Claude Mage, Palaiseau (FR); Vincent Cros, Paris (FR); Alexey Vasilyevich Khvalkovskiy, Boulogne Billancourt (FR); Julie Grollier, Paris (FR)

(73) Assignees: THALES (FR); CENTRE NATIONAL DE LA RECHERCHE SCIENTIFIQUE (FR); UNIVERSITE PARIS-SUD 11 (FR)

( * ) Notice: Subject to any disclaimer, the term of this patent is extended or adjusted under 35 U.S.C. 154(b) by 0 days.

(21) Appl. No.: 14/232,188

(22) PCT Filed: Jul. 12, 2012

(86) PCT No.: PCT/EP2012/063725
§ 371 (c)(1),
(2), (4) Date: Apr. 7, 2014

(87) PCT Pub. No.: WO2013/007797
PCT Pub. Date: Jan. 17, 2013

(65) Prior Publication Data
US 2014/0218122 A1 Aug. 7, 2014

(30) Foreign Application Priority Data

Jul. 12, 2011 (FR) .................................. 11 02192

(51) Int. Cl.
*H03B 15/00* (2006.01)
*H03L 7/26* (2006.01)
*H03C 3/09* (2006.01)

(52) U.S. Cl.
CPC .......... *H03B 15/006* (2013.01); *H03C 3/0958* (2013.01); *H03L 7/26* (2013.01)

(58) Field of Classification Search
CPC ....... B82Y 25/00; H01L 43/00; H01L 43/02; H01L 43/08; H03B 15/00; H03B 15/006; H03L 7/26

USPC .................................................... 331/94.1, 96
See application file for complete search history.

(56) References Cited

U.S. PATENT DOCUMENTS 7,936,597 B2 * 5/2011 Clinton et al. ................. 365/173
8,908,424 B2 * 12/2014 Wang et al. .................... 365/158
(Continued)

FOREIGN PATENT DOCUMENTS

FR          2944384          10/2010

OTHER PUBLICATIONS

Locatelli N et al: "Dynamics of two coupled vortices in a spin valve nanopillar excited by spin transfer torque", Applied Physics Letters, AIP, American Institute of Physics, Melville, NY, US, vol. 98, No. 6, Feb. 7, 2011, pp. 62501-62501.

(Continued)

*Primary Examiner* — Levi Gannon
(74) *Attorney, Agent, or Firm* — Davidson, Davidson & Kappel, LLC

(57) ABSTRACT

An oscillator is provided including a nanopillar and current injector for injecting a power supply current through the nanopillar, the nanopillar including at least one pattern including first and second layers made from a ferromagnetic material separated from each other by an intermediate layer made from a non-magnetic material. Each of the first and second ferromagnetic layers is prepared such that its remanent magnetic configuration corresponds to a vortex configuration and the polarity of the vortex core of the first layer is opposite the polarity of the vortex core of the second layer. The intermediate layer can allow repellant magnetic coupling between the two vortices of the first and second layers, for a zero intensity of the power supply current and a zero amplitude of the outside magnetic field.

19 Claims, 5 Drawing Sheets

(56) References Cited

U.S. PATENT DOCUMENTS

| | | | |
|---|---|---|---|
| 2004/0165425 A1* | 8/2004 | Nakamura et al. | 365/171 |
| 2009/0117370 A1 | 5/2009 | Deak | |
| 2012/0068281 A1* | 3/2012 | Saida et al. | 257/421 |
| 2012/0075031 A1 | 3/2012 | Dieny et al. | |
| 2012/0154063 A1* | 6/2012 | Nikonov et al. | 331/94.1 |
| 2012/0243308 A1* | 9/2012 | Saida et al. | 365/173 |
| 2013/0169371 A1* | 7/2013 | Baraduc et al. | 331/94.1 |

OTHER PUBLICATIONS

Wintz S et al: "Direct observation of antiferromagnetically oriented spin vortex states in magnetic multilayer elements", Applied Physics Letters, AIP, American Institute of Physics, Melville, NY, US, vol. 98, No. 23, Jun. 9, 2011, pp. 232511-232511.

Grollier J et al; "Synchronization of spin-transfer oscillators driven by stimulated microwave currents", Physical Review. B, Condensed Matter and Materials Physics, American Institute of Physics, Woodbury, NY, US, vol. 73, Feb. 24, 2006, pp. 60409-1.

Mancoff F B et al: "Angular dependence of spin-transfer switching in a magnetic nanostructure", Applied Physics Letters, AIP, American Institute of Physics, Melville, NY, US, vol. 83, No. 8, Aug. 25, 2003, pp. 1596-1598.

Zabel et al: "Progress in spintronics", Superlattices and Microstructures, Academic Press, London, GB, vol. 46, No. 4, Oct. 1, 2009, pp. 541-553.

Khvalkovskiy A et al: "Nonuniformity of a planar polarizer for spin-transfer-induced vortex oscillations at zero field", Applied Physics Letters, AIP, American Institute of Physics, Melville, NY, US, vol. 96, No. 21, May 28, 2010, pp. 212507-212507.

* cited by examiner

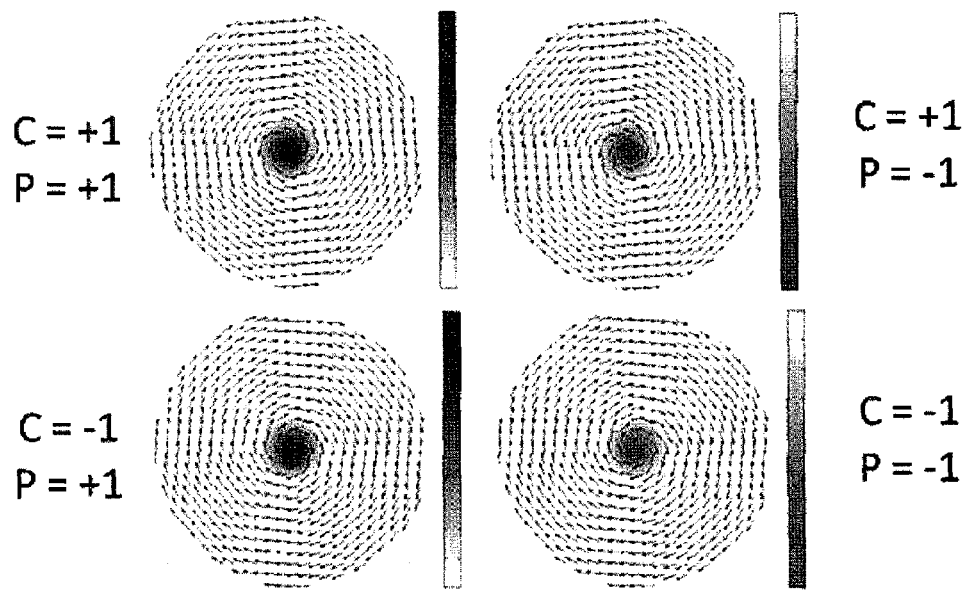
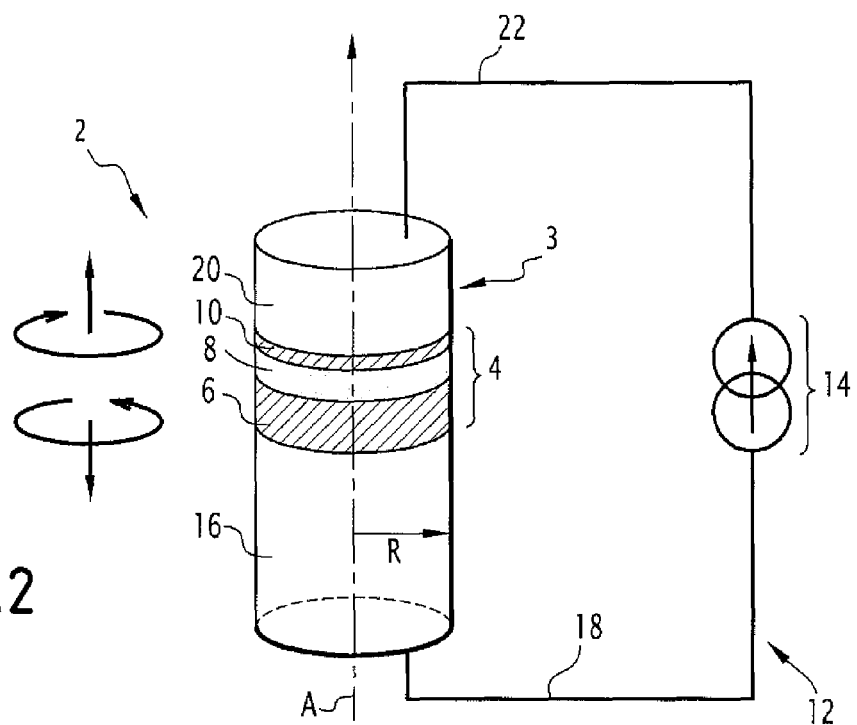
FIG.1
FIG.2

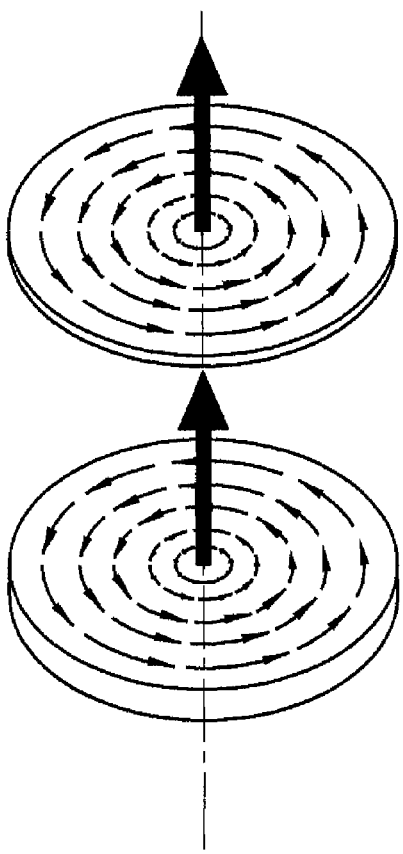
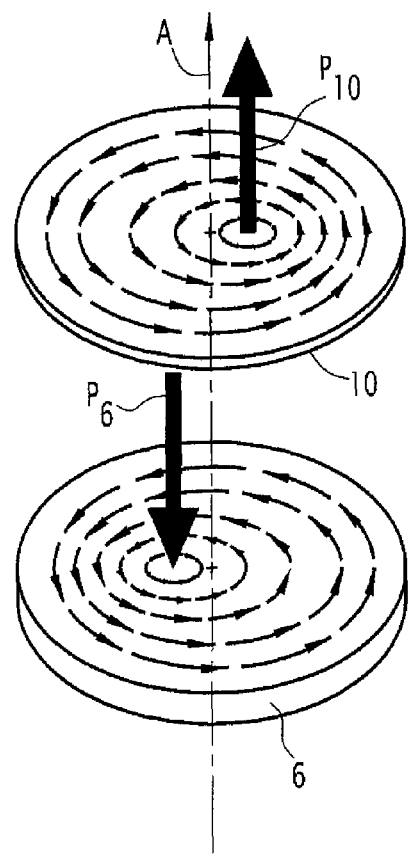
FIG.4      FIG.5
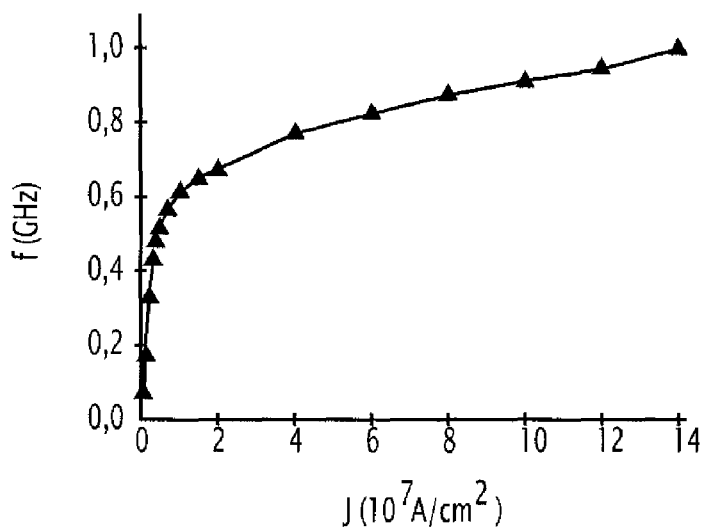
FIG.6

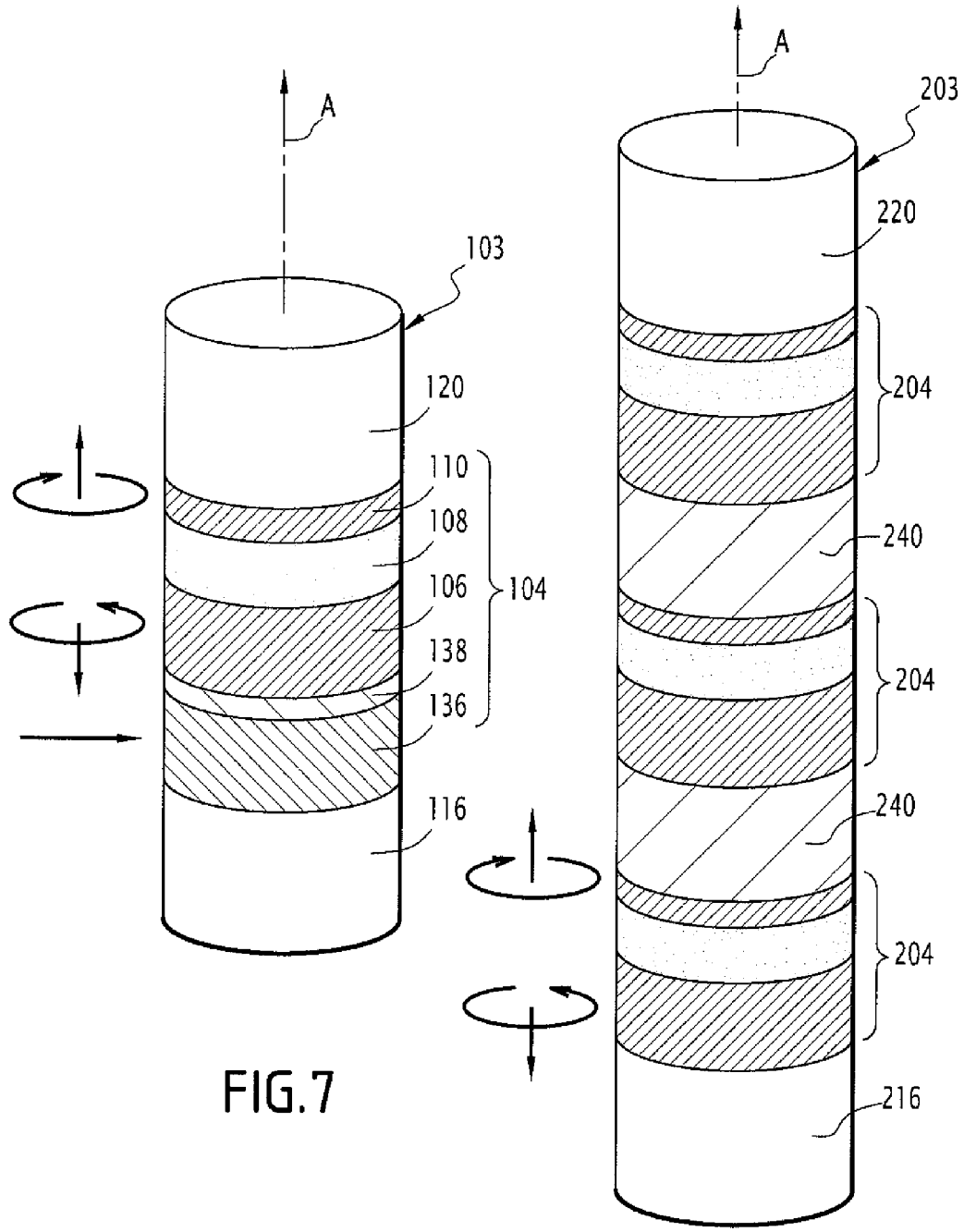

SPINTRONIC OSCILLATOR, AND USE THEREOF IN RADIOFREQUENCY DEVICES

The present invention relates to the field of magnetic oscillators, also called spintronic oscillators, which can be used in frequency synthesis, frequency mixing, frequency detection, etc. systems.

BACKGROUND

In general, radio wave transceiver devices all integrate a stage allowing mixing of a received signal with a reference signal coming from a frequency synthesizer. This mixing stage is often made up of a mixer and a local oscillator integrated into a phase locked loop (PLL). Such a local oscillator uses a technology chosen from among several possible technologies (quartz, acoustic waves, LC circuit, oscillator ring, etc.) based on the desired performance/cost characteristics for the device.

However, whatever the chosen technology, the known oscillators lead to radiofrequency devices with two major problems: on the one hand, the volume of the device, which remains too large; on the other hand, its frequency tuning range is relatively limited (smaller than an octave). In particular, faced with the multiplication of telecommunications standards, a limited tuning range represents a particularly significant obstacle, preventing the possible use of "multi-standard" and/or opportunistic devices.

Consequently, highly integrated radiofrequency devices with a wide frequency band, which are essential to pursue miniaturization of the radiofrequency circuits integrating them, can only be developed based on new types of oscillator.

However, a new type of oscillator, called magnetic, was recently proposed. The operation of a magnetic oscillator is based on the spin-transfer torque physical phenomenon.

The spin-transfer torque phenomenon manifests itself in components with a structure successively including a first ferromagnetic layer (from several nm to several tens of rim thick), a non-magnetic intermediate layer, and a second ferromagnetic layer.

In particular, this spin-transfer torque phenomenon between the charge carriers (electrons or holes) exists in structures called nanopillars made up of a first fine ferromagnetic layer (typically from several nm to several tens of nm), a non-magnetic intermediate layer, and a second fine ferromagnetic layer, these layers having a reduced size in a plane orthogonal to the stacking direction of the layers. Typically, a nanopillar is a cylinder whereof the axis corresponds to the stacking direction of the layers and whereof the radius is typically several tens of nanometers.

The injection of a current through this structure makes it possible to generate a spin-polarized current. The interaction between the spins of the charge carriers (electrons or holes) of the spin-polarized current and the magnetization of the ferromagnetic material of one of the magnetic layers, for example the second layer, results in a torque, called "spin transfer torque", related to the relaxation of all or part of that spin polarization on the magnetization.

The spin transfer phenomenon thus makes it possible to manipulate the magnetization of the second layer without applying a magnetic field, but by applying a power supply current that has been spin polarized. This principle is implemented in the latest generations of MRAM ("Magnetic Random Access Memory") to switch the magnetic configuration in which the magnetic information is stored.

The spin-transfer torque phenomenon therefore causes a modification in the magnetic configuration. This may be detected through a variation of the electrical resistance of the nanopillar. In fact, the electrical resistance of the nanopillar depends on the orientation of the magnetization of the second layer relative to that of the first layer. This magnetoresistive effect is referred to as giant magnetoresistance (GMR) in all-metal nanopillars, and tunnel magnetoresistance (TMR) in nanopillars with tunnel junctions.

The magnetic configuration of a ferromagnetic layer in a nanopillar having nanometric dimensions is a magnetic mono-domain. In fact, the insertion of a wall between two domains having different magnetizations is too expensive in terms of energy, such that such a magnetic configuration is not seen.

However, the residual magnetic configuration, which is the stable configuration resulting from a competition between the exchange energy and the magnetostatic energies, is not necessarily a configuration in which the magnetization is uniform. Another possible type of remnant magnetic configuration corresponds to a so-called "vortex" magnetization. In such a configuration, the magnetic moments, which are essentially planar, wind around the center of the ferromagnetic layer, except in a region surrounding the center of the layer, called vortex core and having a radius of the order of magnitude of the exchange length ($L_{EX}$) of the material (for example, 5-6 nm in Co or the NiFe alloy), where the magnetic moments of the magnetic configuration point outside the plane of the layer, upward or downward. The direction in which the magnetization of the core points defines the polarity of the vortex (P=+/−1). A second parameter of the vortex is its chirality, which corresponds to the winding direction of the magnetic moments around the center of the layer and which may assume two values; C=+1 when they wind in the clockwise direction, or C=−1 when they wind in the opposite direction. A ferromagnetic layer may be in one of the four possible vortex configurations corresponding to a value of the polarity and a value of the chirality. These four configurations are shown in FIG. 1.

Armed with this observation, patent application US 2009/0117370 A1 describes, in the field of magnetic non-volatile memories, the use of a nanopillar including a pattern comprising two magnetic layers, each of them having a residual magnetic vortex configuration. The four chirality configurations of the vortices make it possible to produce a memory with four states. This US patent does not use the polarity of the vortices as a storage degree for the information. Owing to the effects of giant or tunnel magnetic resistance, the measurement of the total resistance of the nanopillar makes it possible to determine the current state of the memory.

Aside from the effects making it possible to modify the static magnetic configurations presented above, the spin-transfer torque phenomenon may also cause (under certain conditions related to the outside magnetic field in which the nanopillar is placed and the intensity of the power supply current injected through it) a continuous oscillation of the magnetic configuration of one or both magnetic layers. This oscillation corresponds to the excitation of dynamic modes related to the static magnetic configuration (uniform, C-state, vortex, etc.), whereof the characteristic frequencies depend on the parameters related to the choices of the component materials of these magnetic layers (saturation magnetization, exchange length, damping coefficient, etc.), as well as the dimensions (radius and thickness for disk-shaped layers) and geometry of the pillar.

Owing to the magnetoresistive effect previously described, any oscillation of all or part of the magnetization of the structure may cause a variation of the resistance of the pillar at a frequency equal to that of the oscillation of the magnetization. An oscillating voltage is then obtained across the terminals of the pillar, the frequency spectrum of which reflects that of the excited magnetic modes of the structure.

This oscillation effect will henceforth be expressed through the microwave frequency power emitted by the nanopillar, which corresponds to the product of the voltage across the terminals of the nanopillar multiplied by the intensity of the power supply current injected through it.

The characteristic frequencies are therefore specific to the nanopillar and may be modulated by acting on the static magnetic configuration. They thus depend on the amplitude of the outside field, the intensity of the power supply current (typically approximately a milliampere, which corresponds to current densities of approximately $10^7$ A/cm$^2$ through a section of the nanopillar), dimensions of the layers of the nanopillar. The range of accessible characteristic frequencies is comprised between several hundred MHz and several tens of GHz.

A component made up of such a nanopillar and suitable means for injecting a power supply current and applying an outside magnetic field so as, by using the spin-transfer torque phenomenon, to place them in a pillar in an excited state corresponding to a continuous oscillation of the magnetic configuration of one or the set of both magnetic layers, constitutes a magnetic oscillator. Thus, for example, in the article by Locatelli et al., it is provided to apply a power supply current for vortex nucleation in the first and second layers of the oscillator, the residual magnetic configuration of which is uniform.

Compared to other existing technologies, such a magnetic oscillator has several advantages such as smaller dimensions, a larger accessible tuning range owing to the variation of the amplitude of the power supply current and an adapted outside magnetic field, change speed of the frequency operating point (for example through adaptive variations of the intensity of the power supply current), and lack of sensitivity to electromagnetic radiation.

SUMMARY OF THE INVENTION

However, several technological obstacles exist:

the application of an outside magnetic field is generally necessary to achieve the state in which the spin-transfer torque causes a continuous oscillation rather than switching.

the relative amplitude of the oscillations between the magnetizations of the two layers remains reduced. Consequently, the electrical power obtained by the oscillation is very low, approximately one picowatt (pW).

the nanometric dimensions of the magnetic oscillators make them particularly sensitive to thermal fluctuations. This results in the existence of a phase noise and an amplitude noise that affect the power signal. The latter has a large line width and the corresponding magnetic oscillator is characterized by low quality factors.

to use the spin-transfer torque phenomenon to initiate one of the dynamic modes of the magnetization, the intensity of the power supply current must reach a high threshold, capable of compensating the dissipative phenomena related to the magnetic relaxation. The intensity of the power supply current must be such that the current density through a section of the nanopillar is approximately $10^7$ A/cm$^2$.

even if the tuning window of a magnetic oscillator, i.e., the frequency range over which it cannot operate based on the intensity of the power supply current, is wide (between several tens of MHz and several tens of GHz), the dependency of the frequency of the oscillations as a function of the intensity of the power supply current has a complex behavior that makes the use of such magnetic oscillators complicated when it involves integrating them into wireless transceiver devices.

The invention therefore aims to resolve the aforementioned problems.

The present invention provides a magnetic oscillator made up of a nanopillar and means for injecting a power supply current through the nanopillar, the nanopillar including at least one pattern including first and second layers, made from a ferromagnetic material, separated from each other by an intermediate layer made from a non-magnetic material, characterized in that each of the first and second ferromagnetic layers is prepared such that its residual magnetic configuration, for a zero amplitude of the outside magnetic field and a zero intensity of the power supply current, corresponds to a highly non-uniform configuration, and such that the component, outside the plane of the first layer, of the remnant magnetic configuration of the first layer is opposite the component, outside the plane of the second layer, of the remanent magnetic configuration of the second layer; and in that the intermediate layer is capable of allowing magnetic coupling between the magnetic configurations of the first and second layers, even for a zero intensity of the power supply current and a zero amplitude of the outside magnetic field, such that magnetic oscillations appear for any non-zero intensity of the power supply current.

The present invention provides a method implementing a magnetic oscillator including a step consisting of applying a power supply current through the or each nanopillar making up the magnetic oscillator, the power supply current leading to a current density through a transverse section of one or each nanopillar between 0 and approximately $1.10^8$ A/cm$^2$, so as to generate an oscillation of the resistance of one or each nanopillar at the characteristic frequency in the range from 0 to approximately 1 GHz.

BRIEF DESCRIPTION OF THE DRAWINGS

The invention will be better understood upon reading the following description, provided solely as a non-limiting example and done in reference to the appended drawings, in which:

FIG. 1 is an illustration of the four vortex shapes associated with a magnetic vortex configuration of a ferromagnetic layer;

FIG. 2 is a diagrammatic illustration of a magnetic oscillator according to the present invention;

FIG. 4 is a diagrammatic illustration of residual magnetic vortex configurations for the first and second ferromagnetic layers having parallel polarities (unfavorable scenario) of the magnetic oscillator according to the invention;

FIG. 5 is a diagrammatic illustration of residual magnetic vortex configurations for the first and second ferromagnetic layers having antiparallel polarities (favorable scenario) of the magnetic oscillator according to the invention;

FIG. 6 is a graph showing the typical variations of the specific frequency of the magnetic oscillator of FIG. 2 as a function of the density of the injected power supply current (results obtained for a digital simulation of a pillar with a diameter of 200 nm, with a Ni/Fe (15 nm)/Cu (10 nm)/NiFe (4 nm) stack);

FIG. 7 is a diagrammatic illustration of a first alternative embodiment of the magnetic oscillator according to the invention, the nanopillar including a pattern having a third magnetic layer separated either from the first layer or from the second ferromagnetic layer by a non-magnetic insulating layer;

FIG. 8 is a diagrammatic illustration of a second alternative embodiment of the oscillator according to the invention, the nanopillar being made by stacking several patterns, each pattern reiterating that of the nanopillar of the oscillator of FIG. 2.

DETAILED DESCRIPTION

Figure 3:
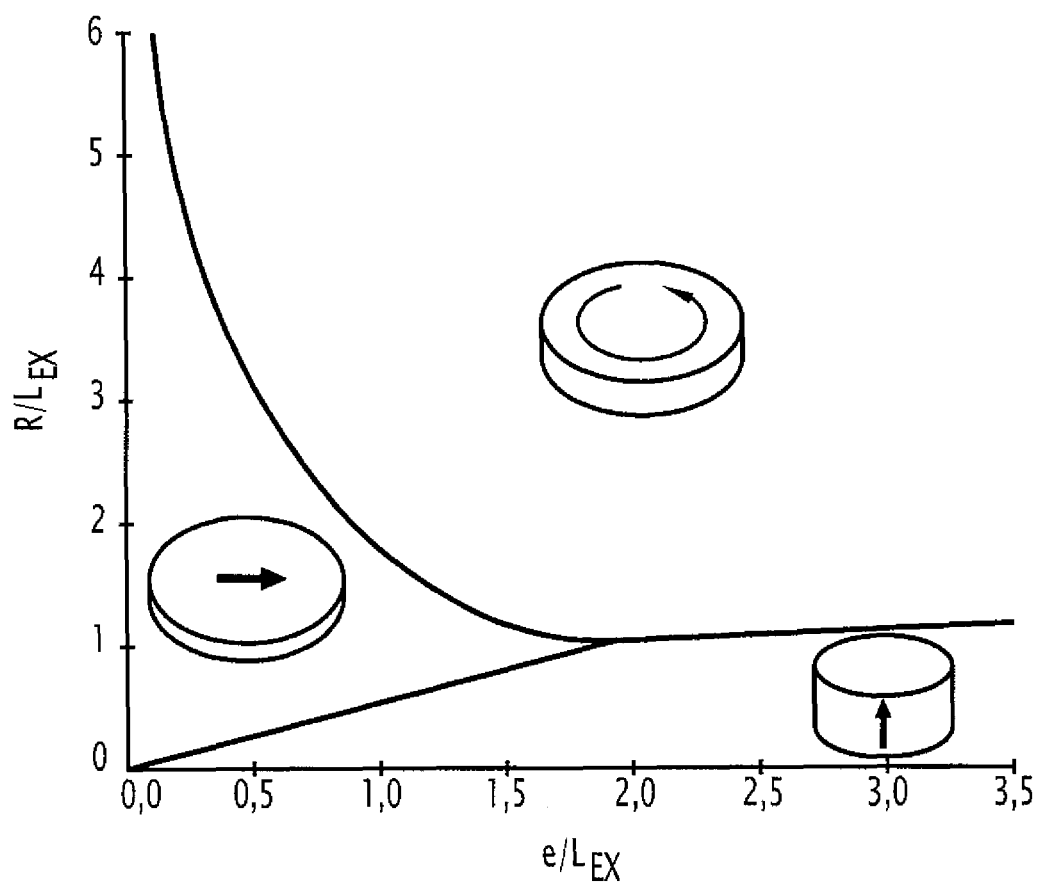
FIG. 3 is a diagram of the fundamental states representing the residual magnetic configurations of a disk-shaped ferromagnetic layer, as a function of the geometric characteristics normalized by the exchange length $L_{EX}$ of the material of the considered layer.

A first embodiment of the magnetic oscillator according to the invention is shown diagrammatically in FIG. 2. The magnetic oscillator 2 includes a nanopillar 3 and means for injecting a power supply current 12 through the nanopillar 3.

The nanopillar 3 includes a pattern 4. The latter is made up, superimposed along a stacking direction A of the layers, of a first layer 6 made from a ferromagnetic material, an intermediate layer 8 made from a non-magnetic material, and a second layer 10 made from a ferromagnetic material.

At each of its ends, the nanopillar 3 respectively includes lower 16 and upper 20 layers that are positioned on either side of the pattern 4 and make up contacts allowing the injection of a power supply current through the layers 6, 8 and 10.

The ferromagnetic materials considered for the magnetic layers are iron Fe, cobalt Co, nickel Ni, and ferromagnetic alloys comprising at least one of those elements (for example, CoFeB), as well as Heusler materials, magnetic oxides or magnetic semiconductors. The ferromagnetic material of the second layer 10 is not necessarily identical to that of the first layer 6.

The non-magnetic intermediate layer 8 is a conductive layer, for example made from copper Cu, gold Au, etc., or an insulating layer, made from $Al_2O_3$, MgO, $SrTiO_3$, etc.

The layers 6, 8 and 10 respectively form disks having a thickness comprised between several tenths and several tens of nanometers, and a radius R of several hundred nanometers, in particular 200 nm.

The thickness of the first layer 6 is 15 nm. More generally, it is comprised between 0.2 and 30 nm.

The thickness of the intermediate layer 8 is 10 nm. More generally, it is comprised between 0.5 and 20 nm.

The thickness of the second layer 10 is 4 nm. More generally, it is comprised between 0.1 and 30 nm.

The lower and upper layers 16 and 20 are made from a material having good electrical conduction properties, such as copper or gold. These layers have a thickness of approximately 25 nm. They preferably have a radius similar to that of the component layers of the pattern 4.

The means 12 capable of allowing the injection of a power supply current through the nanopillar 3 are shown diagrammatically in FIG. 2 by a current source 14 whereof intensity and frequency are adjustable, and electrodes 18 and 22.

These electrodes make it possible to electrically connect the lower and upper layers 16 and 20 to the terminals of the source 14 to inject the power supply current on the one hand, and to a measuring means (not shown) for determining the electrical potential difference at the bushing of the nanopillar 3, i.e., between the lower and upper layers 16 and 20, on the other hand.

The first and second ferromagnetic layers 6 and 10 are characterized by specific residual states. The first and second layers 6 and 10 of the pattern 4 of the nanopillar 3 respectively have a residual magnetic vortex configuration. Only vortex shapes such that the polarity of the vortex of the first layer 6 is opposite the polarity of the vortex of the second layer 10 are selected. This leads to the establishment of a repellant magnetic coupling between the cores of the vortices of the two layers, on the condition that the material and thickness of the intermediate layer 8 are also suitable. Under these conditions, oscillations of the power emitted by the nanopillar 3 appear, irrespective of the intensity of the injected power supply current, i.e., a current threshold brought back to zero.

The meaning and interest of these characteristics will now be explained gradually.

A ferromagnetic layer may be in different magnetic configurations as a function of the value of variables such as the dimensions of the layer, the intensity of the power supply current, the amplitude of the outside magnetic field, the temperature, etc.

The residual magnetic configuration is the stable magnetic configuration of the ferromagnetic layer when the outside magnetic field and the intensity of the power supply current are zero.

For a disk-shaped layer, the remnant magnetic configuration only depends on the values of the thickness and radius variables for that layer. In FIG. 3, a diagram characteristic of the residual magnetic configurations is shown as a function of the thickness e and radius R of the layer, normalized by the exchange length $L_{EX}$ of the material of the considered layer. This diagram shows three domains respectively corresponding to a uniform magnetization in a direction orthogonal to the direction A, a uniform magnetization in the direction A, and a vortex magnetization.

Thus, in the present magnetic oscillator, the first and second layers 6 and 10 are such that their respective residual magnetic configuration corresponds to a vortex magnetic configuration.

FIG. 1 shows a top view of the four possible vortex configurations for a ferromagnetic layer. As indicated in the introduction, a magnetic vortex shape is characterized by a chirality parameter C and a polarity parameter P.

Among the sixteen residual magnetic configurations (or present under the influence of an outside parameter, such as the current) of the nanopillar 6 (four for the first layer 6 and four vortex configurations for the second layer 10), only certain residual magnetic configurations are used to obtain the present magnetic oscillator. These are magnetic configurations in which the polarities of the vortices of the first and second layers are opposite, also irrespective of the chiralities of those two vortices.

In FIG. 4, the vortices of the two layers lead to a residual magnetic configuration of the nanopillar that is not favorable for the present oscillator, since in that case, the threshold current to obtain the oscillations may not tend toward zero and is typically equal to several $10^7$ A/cm$^2$. In FIG. 5, however, the vortices of the first and second layers lead to a residual magnetic configuration of the nanopillar that is suitable for the present oscillator. In fact, in the latter case, the magnetization of the core of the vortex of the first layer 6 is oriented downward ($P_6=-1$), while the magnetization of the vortex core of the second layer 10 is oriented upward ($P_{10}=+1$). The other acceptable residual magnetic configuration for the nanopillar 3 corresponds to $P_6=+1$ and $P_{10}=-1$.

In general, the magnetic coupling between the two vortices makes it such that the system to be considered is a pair of coupled vortices having their own oscillation modes with characteristics different from those where the two magnetic layers are insulated from one another. In the residual state of the nanopillar, the magnetic coupling between the vortices is dominated by a dipolar-type interaction term between the magnetizations of the cores of the two vortices.

Specifically selecting opposite polarities for those two vortices makes the magnetic coupling repellant. This coupling thus tends to repel the vortex core of the first layer 6 relative to the vortex core of the second layer 10, such that, in the residual configuration of the nanopillar, the cores of the two vortices are off-centered relative to the direction A, as shown in FIG. 5.

By applying a magnetization current, even with a low intensity, and owing to the spin-transfer torque phenomenon, this pair of vortices is excited such that the vortices are set in motion. In this excited state of the pair of vortices, corresponding to a dynamic mode of the pair of vortices, the vortices have gyrotropic movements correlated to each other. The trajectories described by each of the two vortices are substantially circular and centered around the direction A. Each excited state has a corresponding value of the frequency of revolution around the direction A.

These correlated gyroscopic movements of the two vortices are at the origin of a variation of the total resistance of the nanopillar: this varies periodically at a specific frequency characteristic of the excited state in which the pair of vortices is found.

It should be noted that if the two vortices have the same polarity, the magnetic coupling between the two cores is attractive, which tends to stabilize the two vortex cores on the axis A of the nanopillar. The confinement of the vortices then being increased, a non-zero power supply current is necessary to excite a dynamic mode of that vortex assembly.

Thus, for the two vortices to be coupled such that, once a low-intensity power supply current has been applied, the resistance of the nanopillar begins to oscillate, i.e., a zero threshold current magnetic oscillator has been produced, it is necessary for the first and second vortices to have opposite polarities. It should be noted that the relative chirality of the two vortices simply determines the sign of the power supply current capable of exciting a magnetic mode of the coupled vortices.

The stack of layers of the nanopillar 3, i.e., lower layer, layers making up the pattern and upper layer, is made using techniques known by those skilled in the art, such as cathode sputtering, molecular jet epitaxy, or pulsed laser ablation.

The disk-shaped layers are formed using techniques combining electronic lithography, optical lithography, laser lithography or focused ion etching, followed by an etching technique, which are also known by those skilled in the art.

Taking into account the diagram of the types of remnant magnetic configuration shown in FIG. 3, the first and second layers of the pattern 4 are prepared so as to have a vortex residual magnetic configuration.

The first and second magnetic layers are additionally prepared such that the polarity of the vortex of the first layer is opposite the polarity of the vortex of the second layer. One simple means for verifying the polarity of the vortex core of a layer consists of applying a magnetic field oriented in the direction of the axis A of the layer during the preparation phase.

During the preparation of the first and second ferromagnetic layers, the chirality of the vortices may be verified by applying a suitable reversal current. The intensity of the reversal current of the chirality depends on the thickness of the ferromagnetic layer. The chirality of the vortices of the first and second layers determines the circulation direction of the power supply current in the nanopillar necessary to excite the continuous oscillation of the magnetic configuration.

The nature of the component material of the intermediate layer 8, as well as the thickness thereof, are adjusted to adapt the amplitude of the magnetic coupling between the cores of the vortices of the first and second layers. This interaction must be strong enough relative to the forces, source of the confinement, for an offset to exist between the two cores at the remanence.

Alternatively, whereas in the preferred embodiment described above in detail the oscillator includes two vortices, alternatively, the residual magnetic configuration of each of the first and second layers corresponds to a strongly non-uniform configuration that has component outside the plane of the considered layer.

A method for using the magnetic oscillator described above includes a step consisting of applying a power supply current through the nanopillar, the intensity of which will have been adjusted so as to conduct at a current density through the transverse section of the nanopillar between 0 and approximately $1.10^8$ A/cm$^2$. As a result, the resistance of the nanopillar oscillates so as to generate a power signal whereof the characteristic frequency is between 0 and 1 or 2 GHz, in particular as a function of the size of the ferromagnetic layers.

The magnetic oscillators according to embodiments of the invention have the following advantages:

It is possible to excite the gyrotropic modes of the pair of vortices at a zero threshold excitation current.

It is possible to excite these gyroscopic modes of the pair of vortices at a zero applied magnetic field.

Starting from a zero applied current, the dependency of the frequency of this magnetic oscillator as a function of the intensity of the applied power supply current has a very strong variation, as illustrated by the curve of FIG. 6. As an example for the parameters selected for FIG. 6, while the intensity of the current conducts at a current density in the nanopillar between 0 and $1.10^7$ A/cm$^2$, the transmission frequency of the oscillator varies between 0 and 0.6 GHz, The variation of the frequency is a function of the density of the power supply current through a section of the nanopillar that is substantially linear between 0 and approximately $1.10^7$ A/cm$^2$. This simple dependency between the frequency and the intensity of the power supply current has the advantage of facilitating processing of the signal when this magnetic oscillator is used in a transceiver device (frequency modulation, phase locked loop, etc.).

The variation of the frequency as a function of the intensity variation (df/di) at the foot of the curve of FIG. 6 is approximately 500 MHz/mA. Based on the nature of the materials of the different layers, their dimensions and their thickness, variations between 100 MHz/mA and 1 GHz/mA are considered. The magnetic oscillators according to embodiments the invention are thus made agile over a frequency range extended by a variation of the intensity of the power supply current over a reduced range, without applying an outside magnetic field.

The oscillator is very compact, since its volume is approximately several hundred nm³, compared to several µm³ for "ring" oscillators or even several mm³ for LC oscillators, which are the only technologies compatible with CMOS electronics and are therefore in competition with the technology of the present magnetic oscillator. In particular, it does not need to integrate means making it possible to submerge the nanopillar in an outside magnetic field.

Different alternative embodiments are considered to improve the electric power produced by the nanopillar of the oscillator.

In the first alternative of the magnetic oscillator, shown in FIG. 7, in addition to having first and second ferromagnetic layers 106 and 110, as well as an intermediate layer 108 situated between the first and second layers, the pattern 104 of the nanopillar 103 of that oscillator includes a third magnetic element 136. This element 136 may be a simple ferromagnetic layer having a fixed and uniform magnetization. One alternative for this type of element 136 is a set of two ferromagnetic layers coupled by exchange coupling and biased by an anti-ferromagnetic layer, known by one skilled in the art as synthetic anti-ferromagnetic (SAF). In all cases, this third element 136 acts as a detector.

Favorably, this third magnetic layer 136 is situated below the first layer 106 or above the second layer 110, along the axis A, and is separated therefrom by a separating layer 138. The separating layer is made from an insulating magnetic material (for example, MgO or $Al_2O_3$) and is approximately 1 nm thick. The separating layer 138 forms a magnetic tunnel junction, which is a structure known by those skilled in the art, which has tunnel magnetic resistive ratios that may reach several hundred percent, at ambient temperature. Given that the emitted power, associated with the movement of the pair of vortices, is proportional to the square of the variation of the resistance of the nanopillar 103, the amplitude of the signal is greatly increased by the presence of this separating layer. The signal can thus reach power levels greater than the µW.

In a second alternative shown in FIG. 8, the elementary pattern 204 corresponding to the pattern 4 of the nanopillar of FIG. 2 (formed by a first vortex ferromagnetic layer 6, a non-magnetic intermediate layer 8, and a second vortex ferromagnetic layer with a polarity opposite that of the first layer 10) is repeated at least a second time in the direction A of the nanopillar 203. Likewise, in a variation of this second alternative, the elementary pattern that is repeated is made up of the pattern 104 shown in FIG. 7.

Figure 9:
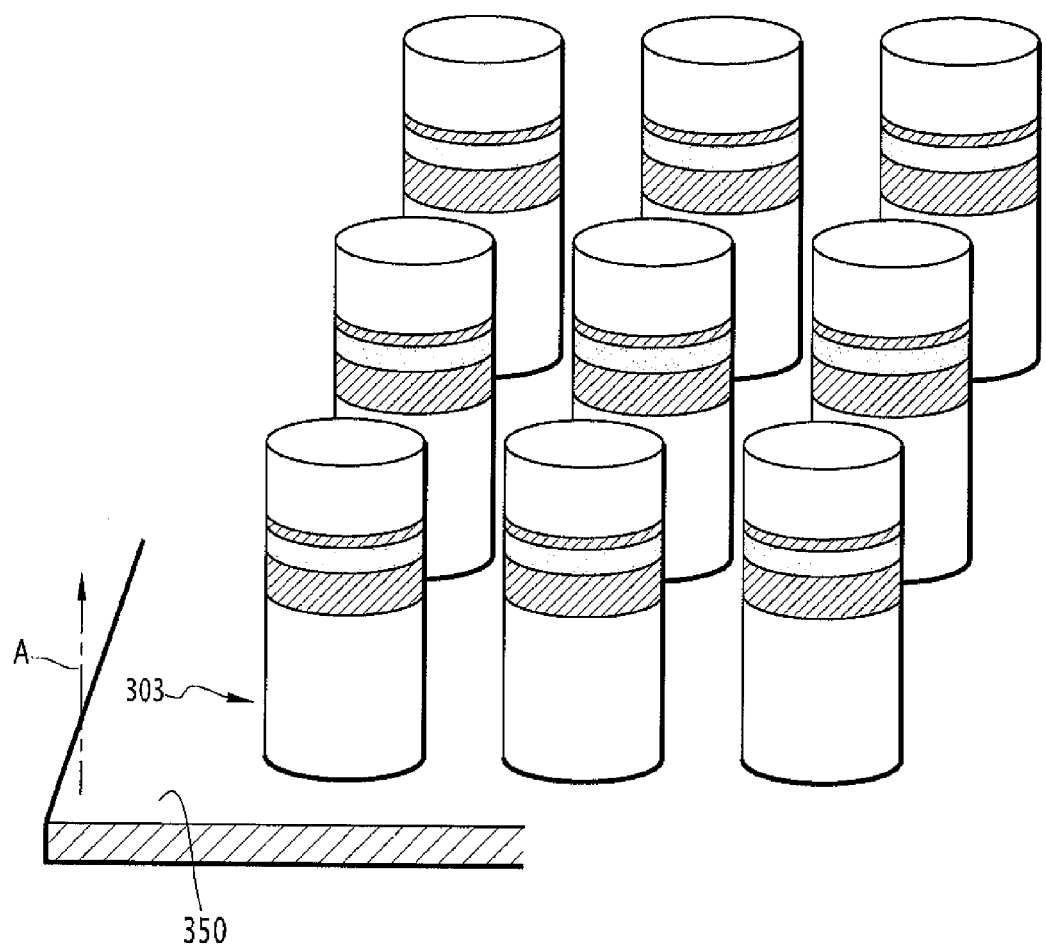
FIG. 9 is a diagrammatic illustration of the third alternative embodiment of the oscillator according to the invention made up of a two dimensional array of nanopillars, each nanopillar being according to that of the oscillator of FIG. 2.

Inside the nanopillar 203, the patterns are separated from each other by a separating layer 240. The latter is made from a metal material and has a thickness suitable for allowing magnetic or electrical coupling between the pairs of vortices of each elementary pattern. Thus, the repetition of an elementary pattern results in coupling the different pairs of vortices of each elementary pattern. In this way, the line width around the characteristic oscillation frequency of the system made up of the coupled pairs of vortices is reduced, This synchronization effect between several patterns is also obtained in a third alternative shown in FIG. 9, where N nanopillars 303, each identical to nanopillar 3 of FIG. 2, nanopillar 103 of FIG. 7 or nanopillar 203 of FIG. 8 (or their alternatives), are arranged periodically, on a same planar substrate 350, so as to form a two-dimensional array.

The means for injecting a power supply current of this oscillator include electrodes making it possible to connect these different nanopillars in parallel or in series across the terminals of the direct-current source (not shown).

The embodiments of the invention therefore make it possible to produce a highly integrated oscillator, compatible with the current CMOS technologies, having a high quality factor and a zero critical power supply current, operating at a zero magnetic field, as well as high agility over a wide frequency range.

The embodiments of the invention are particularly applicable in the wireless communication field:

when it is integrated into a reception/transmission chain of an electromagnetic signal, the present magnetic oscillator makes it possible to replace one or more radiofrequency components typically used, such as the local oscillator or the frequency converter (local oscillator associated with a mixer).

Advantageously, given the multiplication of telecommunications frequency standards, the fact that this oscillator can be tuned over a wide frequency range, advantageously with a high tuning capacity df/di and a high frequency agility (df/dt), makes it possible to obtain multi-standard devices and/or to better occupy a frequency band allocated to a particular communication standard.

In one possible use making it possible to produce a modulation of the frequency of the signal emitted by the oscillator, the power supply current applied to the nanopillar is modulated at a low frequency faced with the characteristic frequency of the oscillations of the resistance of the nanopillar.

In another use, the current of the magnetic oscillator is commanded to be inserted in a phase locked loop.

The embodiments of the invention may also be used to produce frequency mixing. Then, in addition to the direct power supply current making it possible to vary the resistance at a characteristic frequency $f_0$ (associated with the pulse $\omega_0$), an alternating current is injected through the nanopillar, the voltage signal V(t) across the terminals of the nanopillar results from the product of the oscillation of the resistance R of the nanopillar (around the value $R_0$) and the intensity i(t) of that alternating current:

$$V(t)=(R_0+\Delta R \cos(\omega_0 t))*i(t)$$

The embodiments of the invention then perform the "multiplier" function. This function may be used to produce a frequency shift, for example in the case of a frequency demodulation device. In particular, applying an alternating current to the specific frequency of the magnetic mode results in modifying the direct component of the voltage across the terminals of the nanopillar.

It is also possible only to apply an alternating current through the nanopillar. It is possible, when the frequency of the alternating current is close to the characteristic frequency of a mode of the nanopillar, to resonate that mode. This results in varying the direct component of the voltage across the terminals of the pillar.

The method may include a step for varying the amplitude of the power supply current applied through the nanopillar, so as to scan all of the characteristic frequency ranges of the magnetic oscillator, and a step for using the direct component of the voltage across the terminals of the nanopillar to measure the spectral density of an alternating signal that may be an alternating current or radiofrequency field.

Alternatively, the power supply current includes an alternating component, and the use of the oscillator includes a step for studying the direct component of the voltage signal generated across the terminals of the nanopillar.

The invention claimed is:

1. A magnetic oscillator comprising:
a nanopillar; and
a current injector for injecting a power supply current through the nanopillar, the nanopillar including at least one pattern including a first ferromagnetic layer, a second ferromagnetic layer and an intermediate layer, the first ferromagnetic layer and the second ferromagnetic layer being made from a ferromagnetic material and being separated from each other by the intermediate layer, the intermediate layer being made from a non-magnetic material,
each of the first and second ferromagnetic layers having a residual magnetic configuration thereof, for a zero amplitude of an outside magnetic field and a zero intensity of the power supply current, corresponding to a first and second vortex respectively, and such that a polarity of the first vortex is opposite a polarity of the second vortex,
the intermediate layer having a thickness between 0.5 and 20 nm so as to establish a repellant magnetic coupling between the polarity of the first vortex and the polarity of the second vortex, even for a zero intensity of the power supply current and a zero amplitude of the external magnetic field, such that magnetic oscillations appear for any non-zero intensity of the power supply current, the magnetic oscillator having a zero current threshold.

2. The magnetic oscillator as recited in claim 1 wherein a characteristic frequency of the magnetic oscillations and, consequently, of a resistance of the nanopillar, is in the range of 0 to approximately 1 GHz, as a function of the intensity of the power supply current and/or sizes of the first and second ferromagnetic layers.

3. The magnetic oscillator as recited in claim 2 wherein the intensity of the power supply current delivered by the current injector corresponds to a current density through a transverse section of the nanopillar between 0 and approximately $1.10^8$ A/cm$^2$.

4. The magnetic oscillator as recited in claim 3 wherein a variation of the characteristic frequency of the magnetic oscillations of the resistance of the nanopillar according to a variation of the density of the power supply current is between 10 and 1000 Hz.A$^{-1}$.cm$^2$.

5. The magnetic oscillator as recited in claim 3 wherein the power supply current is modulated, at a low frequency relative to the characteristic frequency of the oscillations of the resistance of the nanopillar, so as to produce a frequency modulation of a signal emitted by the oscillator.

6. The magnetic oscillator as recited in claim 3 wherein the power supply current includes a direct component and an alternating component, a voltage signal emitted by the oscillator being the product of an intensity of the alternating component with an oscillation of a resistance of the nanopillar.

7. The magnetic oscillator as recited in claim 1 wherein the ferromagnetic material of the first ferromagnetic layer and/or the ferromagnetic material of the second ferromagnetic layer are chosen from the group consisting of iron, cobalt, nickel and alloys thereof, as well as magnetic oxides, Heusler materials and magnetic semiconductors.

8. The magnetic oscillator as recited in claim 1 wherein the non-magnetic material of the intermediate layer is chosen in the group consisting of copper; gold; and aluminum, magnesium and titanium oxides.

9. The magnetic oscillator as recited in claim 1 wherein the first ferromagnetic layer has a thickness between 0.2 and 30 nm and the second ferromagnetic layer has a thickness between 0.1 and 30 nm.

10. The magnetic oscillator as recited in claim 9 wherein the first ferromagnetic layer has a thickness of 15 nm, the intermediate layer has a thickness of 10 nm and the second ferromagnetic layer has a thickness of 4 nm.

11. The magnetic oscillator as recited in claim 1 wherein the pattern of the nanopillar includes third ferromagnetic layer and a non-magnetic separating layer, the third ferromagnetic layer being above the second ferromagnetic layer or below the first ferromagnetic layer, a magnetic configuration of the third ferromagnetic layer corresponding to a fixed and uniform magnetization, the third ferromagnetic layer being separated from the first or second ferromagnetic layer by the non-magnetic separating layer.

12. The magnetic oscillator as recited in claim 11 wherein the non-magnetic separating layer is insulating.

13. The magnetic oscillator as recited in claim 1 wherein the at least one pattern includes a plurality of patterns, the nanopillar being made up of a vertical stack of the plurality of patterns, each of the patterns being separated from a previous one by a respective metal non-magnetic layer.

14. The magnetic oscillator as recited in claim 1 wherein the current injector includes an adjustable current source and electrodes for connecting the first ferromagnetic layer and the second ferromagnetic layer.

15. The magnetic oscillator as recited in claim 1 further comprising multiple additional nanopillars, the nanopillar and the multiple additional nanopillars being positioned so as to be connected across terminals of a current source to form a planar two-dimensional array.

16. A radiofrequency device integrating the magnetic oscillator as recited in claim 1.

17. The radiofrequency device as recited in claim 16 wherein the oscillator is current controlled and, inserted into a phase locked loop.

18. A method operating the magnetic oscillator of claim 1, the method comprising: varying an intensity of the power supply current applied to the nanopillar, so as to scan all of a range of characteristic frequencies of the magnetic oscillator, and using a direct component of the voltage across the terminals of the nanopillar to measure a spectral density of an alternating signal, that may be an alternating current or radiofrequency field.

19. The method as recited in claim 18 wherein, the power supply current including an alternating component, the method comprises studying the direct component of a voltage signal generated across terminals of the nanopillar.

* * * * *